(12) United States Patent
Hoier et al.

(10) Patent No.: US 9,780,053 B2
(45) Date of Patent: Oct. 3, 2017

(54) METHOD OF FORMING A BONDPAD AND BONDPAD

(71) Applicant: Infineon Technologies AG, Neubiberg (DE)

(72) Inventors: Magdalena Hoier, Regensburg (DE); Peter Scherl, Regensburg (DE); Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/941,633

(22) Filed: Nov. 15, 2015

(65) Prior Publication Data

US 2016/0141259 A1    May 19, 2016

(30) Foreign Application Priority Data

Nov. 19, 2014 (DE) .................. 10 2014 116 956

(51) Int. Cl.
*H01L 21/00* (2006.01)
*H01L 23/00* (2006.01)
*H01L 21/02* (2006.01)

(52) U.S. Cl.
CPC .............. *H01L 24/05* (2013.01); *H01L 24/03* (2013.01); *H01L 24/49* (2013.01); *H01L 21/02697* (2013.01); *H01L 24/45* (2013.01); *H01L 2224/02166* (2013.01); *H01L 2224/03831* (2013.01); *H01L 2224/04042* (2013.01); *H01L 2224/05015* (2013.01); *H01L 2224/0518* (2013.01); *H01L 2224/0568* (2013.01); *H01L 2224/05144* (2013.01); *H01L 2224/05147* (2013.01); *H01L 2224/05155* (2013.01); *H01L 2224/05164* (2013.01); *H01L 2224/05644* (2013.01); *H01L 2224/05647* (2013.01); *H01L 2224/05655* (2013.01); *H01L 2224/05664* (2013.01); *H01L 2224/45124* (2013.01); *H01L 2224/45139* (2013.01); *H01L 2224/45144* (2013.01); *H01L 2224/45147* (2013.01); *H01L 2224/4845* (2013.01); *H01L 2224/48453* (2013.01); *H01L 2224/48455* (2013.01); *H01L 2224/48463* (2013.01)

(58) Field of Classification Search
CPC ................................ H01L 24/05; H01L 24/03
See application file for complete search history.

(56) References Cited

U.S. PATENT DOCUMENTS

| | | | | |
|---|---|---|---|---|
| 3,617,818 A | * | 11/1971 | Fuller | H01L 21/00 257/763 |
| 5,686,762 A | | 11/1997 | Langley | |
| 6,462,414 B1 | * | 10/2002 | Anderson | H01L 21/4853 228/180.22 |
| 6,577,017 B1 | | 6/2003 | Wong | |
| 6,982,493 B2 | | 1/2006 | Petrarca et al. | |
| 2005/0077626 A1 | * | 4/2005 | Seiller | H01L 24/05 257/748 |
| 2006/0035453 A1 | * | 2/2006 | Kim | H01L 21/4853 438/613 |
| 2011/0156260 A1 | | 6/2011 | Huang | |

* cited by examiner

*Primary Examiner* — William Harriston

(57) ABSTRACT

Various embodiments provide a method of forming a bondpad, wherein the method comprises providing a raw bondpad, and forming a recess structure at a contact surface of the raw bondpad, wherein the recess structure comprises sidewalls being inclined with respect to the contact surface.

15 Claims, 3 Drawing Sheets

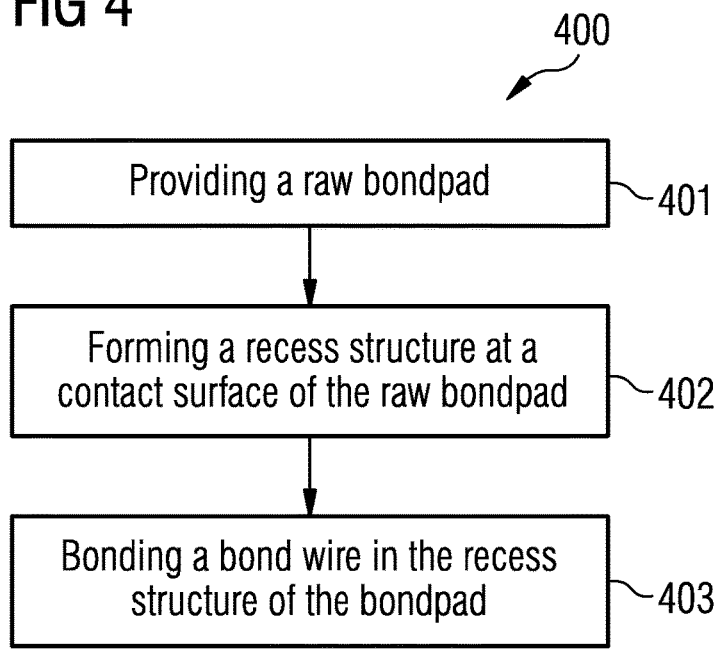
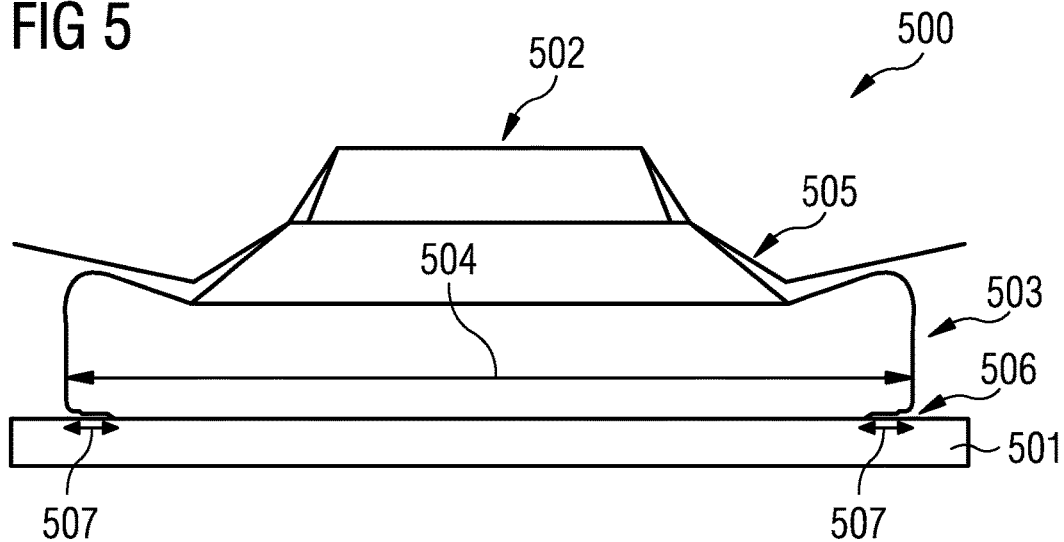

US 9,780,053 B2

METHOD OF FORMING A BONDPAD AND BONDPAD

TECHNICAL FIELD

Various embodiments relate to a method of forming a bondpad, a bondpad and a chip design.

BACKGROUND

In the field of manufacturing power modules or power packages often bonding processes are used to connect a die including a bondpad and an external lead via a bond wire to form a chip design. FIG. 5 schematically shows a detail of such a chip design. In particular, FIG. 5 shows a chip design 500 including a bondpad 501 on which a bond wire 502 is bonded using a capillary bonding tool in an (ultrasonic) capillary bonding process so that a so-called nailhead 503 is formed having a nailhead diameter D indicated by arrows 504. A typical face angle design of the capillary of the capillary bonding tool is indicated by lines 505 in FIG. 5. In addition, so-called gaps 506 are indicated in FIG. 5 at an outer perimeter of the nailhead at which no direct contact between the bondpad and the nailhead is given. This region is indicated in FIG. 5 by the arrows 507.

From US 2009/194577 A1 a wire bonding method is known, including the process of performing a first bonding to a planar bondpad of a die that is a first bond point, and the process of performing a second bonding to an interconnect wiring (or a lead) that is a second bond point, thus connecting the pad and the interconnect wiring with a wire. A bump is first formed on a pad, and, in a wire cutting step performed during the step of forming the bump, the wire protruding from the tip end of a capillary is bent in the lateral direction to form a bent part, and then the bent part is bonded to the bump, thus completing the first bonding process; after which the wire is bonded to the interconnect wiring, thus completing the second bonding process.

SUMMARY

Various embodiments provide a method of forming a bondpad, wherein the method comprises providing a raw bondpad, and forming a recess structure at a contact surface of the raw bondpad, wherein the recess structure comprises sidewalls being inclined with respect to the contact surface.

Furthermore, various embodiments provide a bondpad for wire bonding with a bond wire, wherein the bondpad comprises a recess structure formed in a contact surface of the bondpad, wherein the recess structure comprises sidewalls being inclined with respect to the contact surface.

Moreover, various embodiments provide a chip design comprising a die comprising a bondpad according to various embodiments; and a bond wire bonded to the recess structure of the bondpad.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIG. 4 is a simplified flowchart of a method of forming a bondpad and subsequent bonding of a bond wire; and FIG. 5 schematically shows a detail of a chip design.

DETAILED DESCRIPTION

Figure 1A:
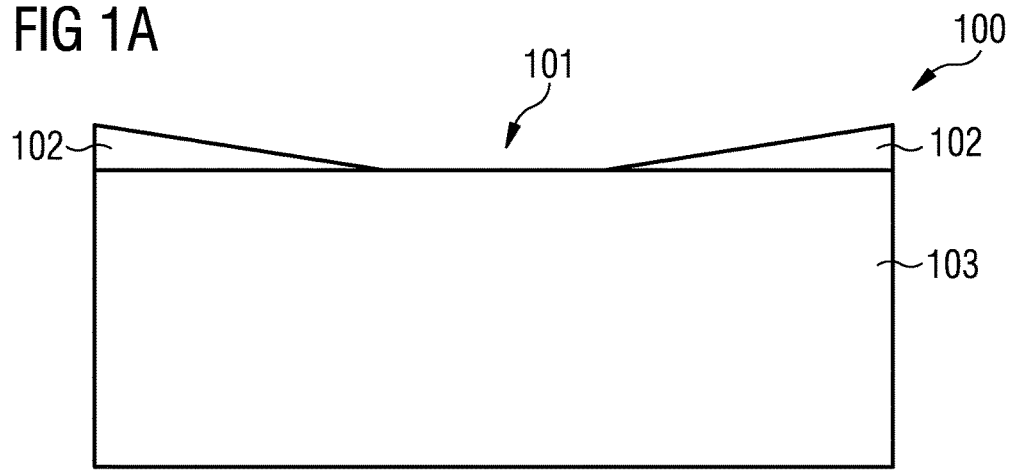
FIGS. 1A to 1C schematically show embodiments of a bondpad according to exemplary embodiments.

In the following further exemplary embodiments of a method of forming a bondpad, a bondpad and a chip design or chip arrangement will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method of bonding a bonding wire to a bondpad, wherein the method comprises providing a bondpad formed from a raw bondpad, in which a recess structure at a contact surface of the raw bondpad is formed, wherein the recess structure comprises sidewalls being inclined with respect to the contact surface; and bonding a bond wire to the recess structure by a bonding process. In particular, the bond wire may form a nailhead at the bonding point and the nailhead may have a larger diameter than the recess structure. Thus, the nailhead may form an overhang extending over the recess structure. For example, the bonding process may be an ultrasonic (capillary) wire bonding process.

In particular, the term "inclined" may particularly denote the fact that a pointed or acute angle is formed which substantially differs from a right angle. That is, the term "inclined" may particularly exclude a right angle or substantially right angle. Thus, the recess structure having or comprising inclined sidewalls may to be distinguished from a recess structure having sidewalls substantially perpendicular to the surface of the raw bondpad. For example, the inclination angle may be less than 45° degree or 60° degree.

By providing a bondpad and a method of manufacturing a bondpad for wire bonding wherein the bondpad comprises willingly inclined sidewalls it may be possible to avoid (or at least reduce the size of) gaps between the bondpad and a wire bonded to the bondpad, e.g. by an ultrasonic wire bonding process. These gaps often occur in case of ultrasonic wire bonding at the outer perimeter of the bonding contact in case bondpads having a substantially flat or planar surface are used.

In particular, it may be possible to increase a pressure force at the outer perimeter during the bonding procedure, without (substantially) increasing the pressure imposed to the center portion or point of the bonding wire. In other words a ball of wire material formed during the bonding procedure at the end of the bond wire may be more evenly (in the sense of pressure force and/or distance) pressed to the surface of the bondpad, possibly leading to a reduced chance of gaps formed between the wire material and the bondpad material at an outer perimeter of the bonding contact. In particular, the reduction of the gap size may be possible without adapting bond parameters. In particular, in case of (ultrasonic) capillary wire bonding the probability that in an outer area or perimeter of the capillary the pressure force is too low to ensure a good contact without excessive gaps.

In the following exemplary embodiments of the method of forming a bondpad are described. However, the features and elements described with respect to these embodiments can be combined with exemplary embodiments of the bondpad and the chip design.

According to an exemplary embodiment of the method the sidewalls comprise an inclination angle in the range between 2° and 60° degree.

In particular, the inclination angle may be in the range of 2° to 35° degree, preferably in the range of 2.5° to 25° degree, e.g. in the range of 5° to 20° degree. It should be noted that in case of curved inclined sidewalls, e.g. a concave recess structure, the inclination angle may be defined as a mean inclination angle, e.g. defined from a center of the recess structure to the joining point of a surface (substantially) parallel to the surface of the raw bondpad and the inclined sidewall.

According to an exemplary embodiment of the method the recess structure is formed by removing a surface portion of the raw bondpad.

According to an exemplary embodiment of the method the removing is performed by an etching step.

In particular, the etching may be performed by dropping or contacting an etchant agent or chemical on the raw bondpad. Alternatively, the removing may be performed by a polishing or milling or the like. In particular, the recessed surface may form a concave shape, e.g. a spherical or ellipsoid shape. After the etching step a cleaning step may be performed in which residual etchant agent may be removed and/or a cleaning step may be performed.

According to an exemplary embodiment of the method the recess structure is formed by depositing additional material on the raw bondpad.

In particular, the additional material may be deposited only in an edge portion of the bondpad. Alternatively, the additional material may be formed over the total surface of the raw bondpad, but having different thicknesses along a cross-sectional view through the bondpad. By using additional material to form the recess structure it may be possible to form the bondpad by an easy adaptation of a common pad manufacturing process, in particular, only relatively small adaptations may be necessary so that a simple integration in common processes may be possible. It should be noted that a manufacturing of the raw bondpad and of the depositing of the additional material may be a continuous (deposition) process in which processing parameter may be changed or modified in order to form the recess structure. Alternatively, the additional material may be deposited during another separated process or process step.

According to an exemplary embodiment of the method the additional material is the same material from which the bondpad is formed.

According to an exemplary embodiment of the method the recess structure has a conical form.

For example, the recessed surface may form a cone or truncated cone. The term "cone" or "conical" may particularly denote that in a cross-sectional view the surface of the sidewall(s) forms a straight line, e.g. having no curvature.

According to an exemplary embodiment of the method the sidewalls have a continuous surface.

In particular, the term "continuous surface" may denote the fact that the surface is smooth in that sense that in a cross-sectional view the sidewalls (starting from the center point of the recess structure) forms a continuous line and does not includes sign changes of the gradient. That is, a gradient or (mathematical) derivation of the sidewalls starting from the center point of the recess structure may not exhibit changes of the algebraic sign; apart from unwillingly production or manufacturing errors or irregularities. However, the gradient may be different as for an ellipsoidal shape, for example. In case of a truncated cone the gradient or derivation may even exhibit points of discontinuity, for example.

In the following exemplary embodiments of the bondpad are described. However, the features and elements described with respect to these embodiments can be combined with exemplary embodiments of method of forming the bondpad and the chip design.

In particular, the contact surface of the bondpad may be the surface which is intended or adapted to be contacted by a bond wire, e.g. an upper surface of the bondpad. For example, the bondpad may be suitable to be used for an ultrasonic wire bonding.

According to an exemplary embodiment of the bondpad the recess structure has a size which is smaller than the diameter of the bonded bond wire.

In particular, the size or diameter of the recess structure may be smaller than the diameter of the bonded bond wire or nailhead of the bonded bond wire. For example, the size or diameter of the recess structure may be smaller than 200 micrometer, preferably smaller than 150 micrometer, e.g. smaller than 125 micrometer or 100 micrometer.

According to an exemplary embodiment of the bondpad the sidewalls have a form selected out of the group consisting of a conical form, a spherical form, and an ellipsoidal form.

In particular, the form or shape may be defined in a cross sectional view perpendicular to the contact surface. It should be noted that the conical or cone form may be as well a truncated cone form or shape, e.g. a form including a step in a gradient of the sidewall.

According to an exemplary embodiment of the bondpad the bondpad comprises at least one material selected out of the group consisting of copper, nickel, molybdenum, palladium, gold, and alloys thereof.

In particular, a bondpad comprising a recess structure may be advantageous when be used together with a relatively hard material like copper, for example. For example, the bondpad may (substantially) consists of a NiMoP—Pd—Au alloy or may (substantially) consist of copper.

According to an exemplary embodiment of the bondpad the sidewalls comprise an inclination angle in the range between 2° and 60° degree.

According to an exemplary embodiment of the bondpad the bondpad has a thickness in the range between 25 micrometer and 2 millimeter.

In particular, the thickness may be in the range between 50 micrometer and 1 millimeter, preferably in the range between 100 micrometer and 500 micrometer.

In the following exemplary embodiments of the chip design are described. However, the features and elements described with respect to these embodiments can be combined with exemplary embodiments of method of forming the bondpad and the bondpad.

In particular, a gap between an upper surface of the recess structure, e.g. the sidewalls, and the bonded bond wire may be smaller than 5 micrometer in length, preferably smaller than 2.5 micrometer in length.

According to an exemplary embodiment of the chip design the bond wire extends beyond the periphery of the recess structure.

In particular, the bond wire may form a kind of nailhead at the end where it is bonded to or bonded in the recess structure and may have a diameter which is larger than a diameter of the recess structure. Thus, it may be the case that the bond wire forms a kind of overhang extending over or overlapping the perimeter of the recess structure.

According to an exemplary embodiment of the chip design the bond wire is bonded to the recess structure by an ultrasonic bonding process.

In particular, the bonding process may be a capillary bonding process.

According to an exemplary embodiment of the chip design the bond wire comprises at least one metal out of the group consisting of copper; gold; aluminum; and silver.

In particular, the bond wire may consist or at least substantially consist of one metal. Alternatively, the bond wire may comprise an alloy of a plurality of metals. It should be noted that the use of a bondpad including the recess structure may be particularly useful in case bond wires comprising or consisting of relatively hard materials, like copper, are used, since it may be possible to avoid high pressure forces According to an exemplary embodiment of the chip design the bond wire is bonded to the recess via a wedge-wedge bonding process or a ball-wedge bonding process.

In the following specific embodiments of the method of forming a bondpad, the bondpad and chip design or chip arrangement will be described in more detail with respect to the figures.

Figure 1B:
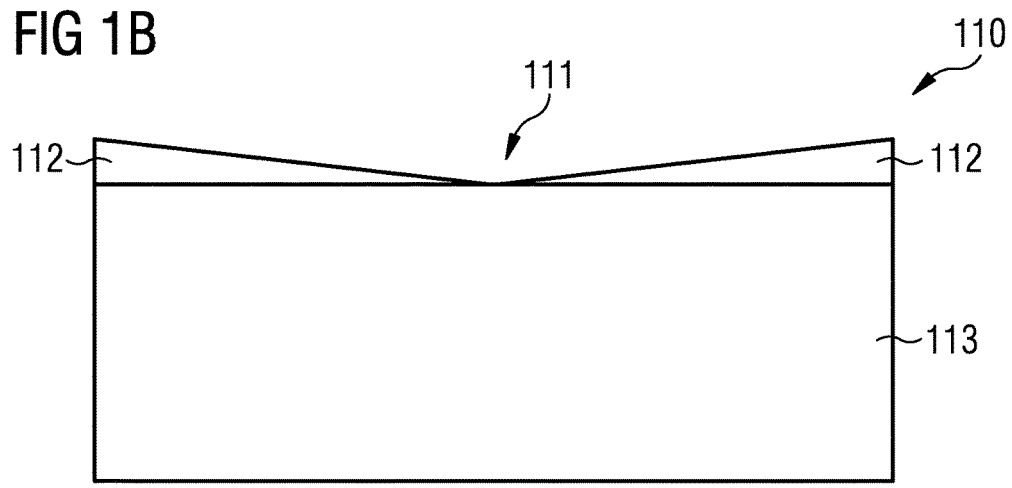
Figure 1C:
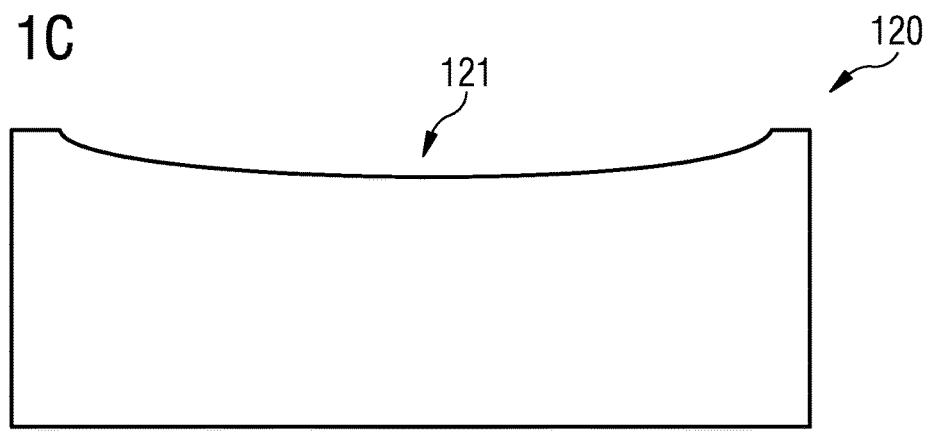

FIGS. 1A to 1C schematically illustrate embodiments of a bondpad according to exemplary embodiments.

In particular, FIG. 1A shows a bondpad 100 comprising a recess structure 101 at a contact surface of the bondpad. According to the embodiment shown in FIG. 1A the recess structure 101 is formed by additional material which is deposited in a wedge-like structure 102 on top of some kind of raw bondpad 103 having a (substantially) planar surface. At the center a flat area is formed by the raw bondpad due to the fact that no additional material is deposited at this center area.

It should be noted that the material of the raw bondpad and the additional material is preferably the same, e.g. copper or a NiMoP—Pd—Au alloy or stack. As shown in FIG. 1A (being a cross-sectional view of the bondpad), the wedge-like structures 102 form sidewalls having an inclined (straight) surface having an inclination angle between 2° and 60° degree.

Since the wedge-like structures 102 are only formed in the outer perimeter of the raw bondpad, the recess structure 101 of the bondpad shown in FIG. 1A forms a kind of truncated cone, i.e. a cone having a cut-off peak (formed by the original raw bondpad in the center area).

In particular, FIG. 1B shows a bondpad 110 comprising a recess structure 111 at a contact surface of the bondpad. According to the embodiment shown in FIG. 1B the recess structure 111 is formed by additional material which is deposited in a wedge-like structure 112 on top of some kind of raw bondpad 113 having a (substantially) planar surface. In contrast to the embodiment shown in FIG. 1A the additional material, i.e. the wedge-like structures 112 are formed covering as well the center area of the raw bondpad so that no flat center area is present any more. Thus, a cone or conical shape of the inclined sidewalls is formed.

In particular, FIG. 1C shows a bondpad 120 comprising a recess structure 121 at a contact surface of the bondpad. In contrast to the embodiments of FIGS. 1A and 1B, according to the embodiment of FIG. 1C no additional material is deposited on a raw bondpad but a recess structure 121 is formed by removing material of the raw bondpad. This can be done by etching, polishing or other ablating processes, for example. Another difference to the embodiments of FIGS. 1A and 1B is that inclined sidewalls of the recess structure 121 do not represent a straight line in a cross-sectional view but represent a curved or concave line. Such a curved or concave recess structure may be formed in an efficient way by an etching process by dropping or applying an etching agent or chemical on a raw bondpad having a flat contact surface.

Figure 2A:
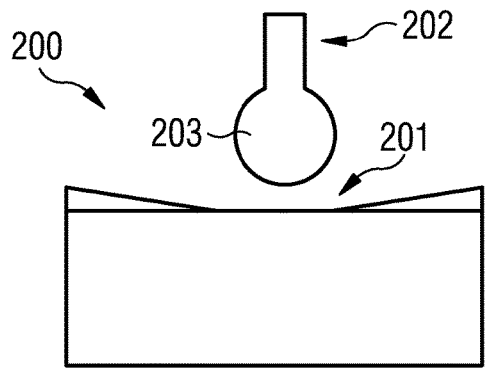
FIGS. 2A and 2B schematically show a bondpad before and after bonding a bond wire thereto.
Figure 2B:
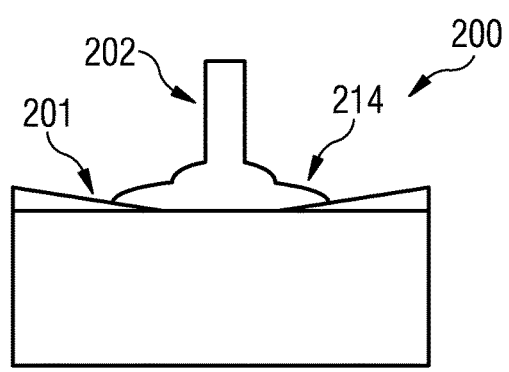

FIGS. 2A and 2B schematically show a bondpad before and after bonding a bond wire thereto. In particular, FIG. 2A shows a bondpad 200 (e.g. a part of a chip or die) as shown in FIG. 1A and having a recess structure 201 of a truncated conical shape, and a bond wire 202 having a ball 203 formed at the end. A typical size or diameter of the ball 203 may be in the range of 80 micrometer to 120 micrometer. The material of the bond wire may be copper, gold, silver or any other material suitable for manufacturing a bond wire.

FIG. 2B shows the arrangement of FIG. 2B subsequent to a bonding step or bonding process during which the ball 203 is pressed into the recess structure 201 of the bondpad 200 during the bonding process. Due to the pressure the ball 203 is deformed and assumes a shape similar to a nailhead 214, i.e. a flatted shape compared to the ball shape 203. Due to the (truncated) conical shape of the recess structure 201 gaps at the periphery of the nailhead between the bondpad and the nailhead may be reduced. In particular, this reduction may be caused by an increase of a relative pressure force at the periphery compared to the case that the bondpad would have a flat contact surface. This may be in particular the case, in case a typical face angle design of a capillary (as shown in FIG. 5) is used in an (ultrasonic) capillary bonding process.

Figure 3A:
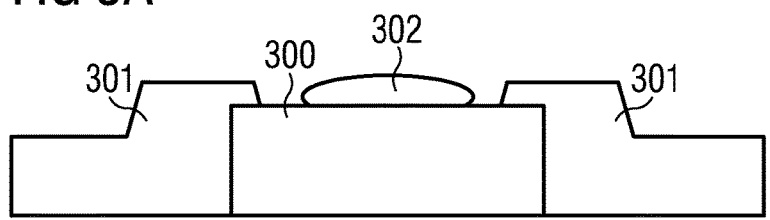
FIGS. 3A to 3C schematically show a method of forming a recess structure in a bondpad and a subsequent bonding of a bond wire to the bondpad.
Figure 3B:
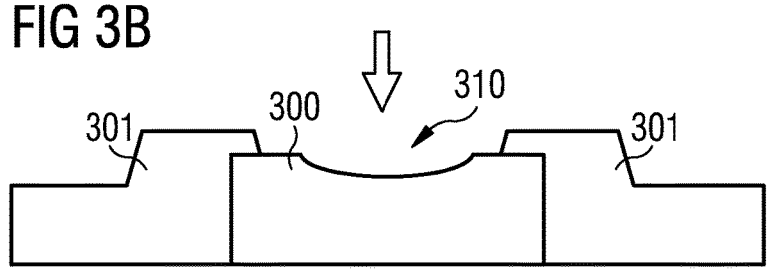
Figure 3C:
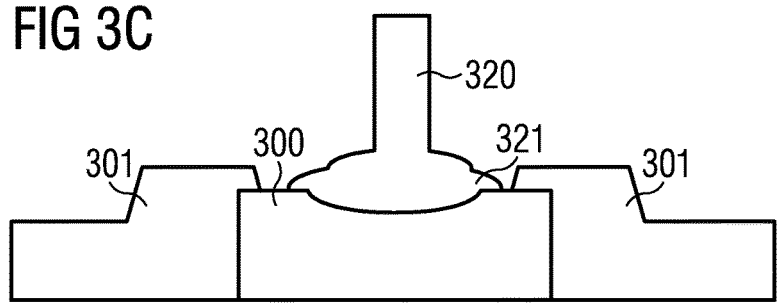

FIGS. 3A to 3C schematically show a method of forming a recess structure in a bondpad and a subsequent bonding of a bond wire to the bondpad. In particular, FIG. 3A shows a bondpad 300 encircled by an imide material 301. On top of the flat surface of the bondpad 300 an etching agent or etching chemistry 302 is applied. The etching agent etches the flat surface of the bondpad 300 so that a recess structure is formed. Subsequent to the etching step (residual) etching agent is removed and the recess structure is cleaned so that a bondpad including a recess structure 310 is formed in the former flat surface of the bondpad 300 as shown in FIG. 3B.

FIG. 3C schematically shows the bondpad 300 of FIG. 3B after a bond wire 320 is bonded to the same. As in FIG. 2B the end of the bond wire is deformed or flattened and assumes a form or shape similar to a nailhead 321.

FIG. 4 is a simplified flowchart of a method of forming a bondpad and subsequent bonding of a bond wire. In particular, FIG. 4 shows a method 400 comprising as a first step the providing of a raw bondpad, e.g. a bondpad having a planar of flat (contact) surface on the side at which subsequently a bond wire shall be bonded (step 401). It should be noted that the bondpad may be a part or portion of a greater element or unit, like a die, chip, package or the like and intended to be used to contact the greater element electrically to leads or other electrical structures.

In a following step 402 a recess structure is formed at the contact surface of the raw bondpad. It should be noted that the recess structure includes sidewalls, i.e. sidewalls exhibiting a gradient which is however smaller than 45° degree or 60° degree, for example. The recess structure may be formed either by removing material of the raw bondpad (e.g. via etching, polishing or the like) or by depositing additional material, e.g. at least on the periphery of the contact surface, on the contact surface.

After the forming of the recess structure the bondpad may be ready to be connected or bond to a bond wire, e.g. by an (ultrasonic) capillary bonding process (step 403).

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming a bondpad, the method comprising:
   providing a raw bondpad having a planar surface or a substantially planar surface; and
   forming a recess structure at a contact surface of the raw bondpad, wherein the recess structure comprises sidewalls being inclined with respect to the contact surface,
   wherein the recess structure is formed by additional material which is deposited on the raw bondpad,
   wherein no additional material is deposited at the center area of the raw bondpad, and
   wherein the additional material is the same material from which the bondpad is formed.

2. The method according to claim 1, wherein the sidewalls comprise an inclination angle in the range between 2° and 60° degree.

3. The method according to claim 1, wherein the sidewalls have a continuous surface.

4. The method according to claim 1, wherein the recess structure has a conical form.

5. A bondpad for wire bonding with a bond wire, the bondpad comprising a recess structure formed in a planar contact surface or a substantially planar contact surface of the bondpad, wherein the recess structure comprises sidewalls being inclined with respect to the contact surface,
   wherein the recess structure is formed by additional material which is deposited on the contact surface,
   wherein no additional material is deposited at the center area of the contact surface, and wherein the additional material is the same material from which the bondpad is formed.

6. The bondpad according to claim 5, wherein the recess structure has a size which is smaller than 200 micrometer.

7. The bondpad according to claim 5, wherein the sidewalls have a form selected out of the group consisting of:
   a conical form,
   a spherical form, and
   an ellipsoidal form.

8. The bondpad according to claim 5, wherein the bondpad comprises at least one material selected out of the group consisting of:
   copper,
   nickel,
   molybdenum,
   palladium,
   gold, and
   alloys thereof.

9. The bondpad according to claim 5, wherein the sidewalls comprise an inclination angle in the range between 2° and 60° degree.

10. The bondpad according to claim 5, wherein the bondpad has a thickness in the range between 25 micrometer and 2 millimeter.

11. A chip design comprising:
    a die comprising a bondpad according to claim 5; and
    a bond wire bonded to the recess structure of the bondpad.

12. The chip design according to claim 11, wherein the bond wire extends beyond the periphery of the recess structure.

13. The chip design according to claim 11, wherein the bond wire is bonded to the recess structure by an ultrasonic bonding process.

14. The chip design according to claim 11, wherein the bond wire comprises at least one metal out of the group consisting of:
    copper;
    gold;
    aluminum; and
    silver.

15. The chip design according to claim 11, wherein the bond wire is bonded to the recess via a wedge-wedge bonding process or a ball wedge bonding process.

* * * * *